United States Patent [19]
Takahumi et al.

[11] Patent Number: 4,999,318
[45] Date of Patent: Mar. 12, 1991

[54] METHOD FOR FORMING METAL LAYER INTERCONNECTS USING STEPPED VIA WALLS

[75] Inventors: Tokunaga Takahumi, Tokorozawa; Tsuneoka Masatoshi; Akimori Hiroyuki, both of Ohme; Horiuch Mitsuaki, Hachiohji, all of Japan

[73] Assignee: Hitachi, Ltd., Tokyo, Japan

[21] Appl. No.: 376,097

[22] Filed: Jul. 6, 1989

Related U.S. Application Data

[63] Continuation of Ser. No. 117,855, Nov. 6, 1987, abandoned.

[30] Foreign Application Priority Data

Nov. 12, 1986 [JP] Japan ............................. 61-267526
Dec. 8, 1986 [JP] Japan ............................. 61-290410

[51] Int. Cl.$^5$ ............................................. H01L 21/44
[52] U.S. Cl. ................................. 437/194; 437/195; 204/192.34
[58] Field of Search ............................... 437/194, 195

[56] References Cited

U.S. PATENT DOCUMENTS

| | | | |
|---|---|---|---|
| 3,754,321 | 8/1973 | Murrmann | 437/194 |
| 4,313,253 | 2/1982 | Henderson, Sr. | 437/195 |
| 4,451,326 | 5/1984 | Gwozdz | 437/198 |
| 4,545,112 | 10/1985 | Holmberg et al. | 437/195 |
| 4,764,484 | 8/1988 | Mo | 437/195 |
| 4,842,991 | 6/1989 | Brighton | 437/195 |

FOREIGN PATENT DOCUMENTS 58-34917 3/1983 Japan.
59-75644 4/1984 Japan.
60-184754 4/1985 Japan.

OTHER PUBLICATIONS

Wolf et al., *Silicon Processing for the VLSI Era*, Lattice Press Sunset Beach (1986), pp. 332-334 and 559-564.

Primary Examiner—Brian E. Hearn
Assistant Examiner—Laura M. Holtzman
Attorney, Agent, or Firm—Pennie & Edmonds

[57] ABSTRACT

A method for forming vias, interconnecting selected wiring layers of an integrated circuit device, which overcomes oxide formation on the wiring metal surface which is exposed at the etched via bottom before filling the via with interconnecting metal. The method first etches the vias through the insulating layer, with a step or stair like wall formation, to expose the underlying metal surface. The exposed metal surface is then sputter etched to remove the undesired oxide layer which forms on the metal surface at the via bottom after being exposed by the etch through process. During the sputter etch oxide removal process, the stair like via wall prevents re-oxidation of the exposed metal surface by stray silicon oxide particles dislodged from the via wall during the sputter process.

12 Claims, 5 Drawing Sheets

METHOD FOR FORMING METAL LAYER INTERCONNECTS USING STEPPED VIA WALLS

This is a continuation of application Ser. No. 07/117,855 filed Nov. 6, 1987.

BACKGROUND OF THE INVENTION

The present invention relates to a semiconductor integrated circuit device and a method of manufacturing the same, and more particularly to techniques which are effective when applied to a semiconductor integrated circuit device having a multilayer wiring structure and a manufacturing method therefor.

In a semiconductor integrated circuit device having a multilayer wiring structure, after lower-layer wiring is formed, an insulator film is formed so as to cover the lower-layer wiring, and this insulator film is used as an inter-layer insulator film and is provided with a contact hole (or through hole), whereupon upper-layer wiring which is connected with the lower-layer wiring through the contact hole is formed. It is considered that the contact hole has its peripheral wall tapered in order to improve the step coverage of the upper-layer wiring.

The inventors made a study on a method of forming the upper-layer wiring in the semiconductor integrated circuit device having the tapered contact hole. The method is not a technique publicly known, but is a technique studied by the inventors, and it is outlined as follows: With the technique studied by the inventors, after lower-layer wiring of aluminum (Al) is formed, a silicon-dioxide ($SiO_2$) film is formed on the whole area of the Al layer as an inter-layer insulator film, and it is provided with a tapered contact hole for connecting upper-layer wiring and the lower-layer wiring. Subsequently, the upper-layer wiring of aluminum is formed. The surface of the lower-layer wiring, however, is formed with an alumina ($Al_2O_3$) film for the reason that the wiring material, aluminium has the property of liability to surface oxidation. Therefore, when the upper-layer wiring is formed under this state left intact, the continuity between the upper and lower wiring layers becomes inferior due to the alumina film which covers the surface of the lower-layer aluminum wiring exposed through the contact hole. In order to prevent this drawback, before the formation of the upper-layer wiring, sputter-etching is carried out thereby to remove the alumina ($Al_2O_3$) film and to denude the surface of the aluminium wiring. Thereafter, the upper-layer wiring is formed.

Meanwhile, in the official gazette of Japanese Patent Application Laid-open No. 140720/ 1985, it is discussed that only the parts of the peripheral wall of a contact hole extending in the lengthwise direction of lower-layer wiring are provided with stair-like steps, thereby to enhance the step coverage of upper-layer wiring in the contact hole.

SUMMARY OF THE INVENTION

The aforementioned technique studied by the inventors has drawbacks as stated below:

When the alumina film covering the aluminum wiring of the lower-layer wiring is removed by the cleaning of the surface of the lower-layer wiring based on the sputter-etching, there occurs the problem that the tapered peripheral wall of the contact hole is sputter-etched, so silicon-dioxide particles resulting from the sputter-etching scatter to adhere to the surface of the lower-layer aluminium wiring exposed through he contact hole. The inventors have also discovered the consequent problem that, although the region of the contact hole is intened to electrically continue the upper-layer wiring and the lower-layer wiring, the insulator of silicon dioxide intervenes in the electrical contact region to incur an inferior continuity between the upper and lower wiring layers. In particular, it is known that the etching rate of sputter-etching is great in a case where the angle of incidence of particles to sputter a sample, with respect to the sample is 40-60 degrees, and the sputter-etching is carried out efficiently with this angle of incidence. In this regard, however, the inventors have discovered that the inclination angle of the tapered peripheral wall of the contact hole is substantially equal to the angle of incidence of the sputtering particles at which the etching rate of the sputter etching is great. The inventors have verified the consequent problem that, in the case where the lower-layer wiring exposed through the contact hole is cleaned by the sputter etching in the multilayer wiring structure having the tapered contact hole, the peripheral wall of the contact hole is subjected to a sputter-etching condition of great etching rate, under which the silicon dioxide is sputtered and etched from the peripheral wall, so the insulator of silicon dioxide in a large amount adhere to the lower-layer wiring.

On the other hand, the technique disclosed in the official gazette of Japanese Patent Application Laid-open No. 140720/1985 has the problem that, in a case where the upper-layer wiring and the lower-layer wiring intersect to each other by way of example, the step coverage of the upper-layer wiring cannot be improved because no stair-like steps are provided int he widthwise direction of the lower-layer wiring.

An object of the present invention is to provide a semiconductor integrated circuit device which can enhance the step coverage of wiring in the contact hole area of an inter-layer insulator film for multilayer wiring, as well as a method of manufacturing the same.

Another object of the present invention is to provide a semiconductor integrated circuit device which can prevent the inferior continuity between the upper-layer wiring and lower-layer wiring of a multilayer wiring structure, as well as a method of manufacturing the same.

The above and other objects and novel features of the present invention will become apparent from the description of this specification and the accompanying drawings.

Typical aspects of performance of the present invention are summarized as follows:

A contact hole for multilayer wiring is so configured as to have a plurality of stair-like steps over the whole peripheral wall thereof.

In addition, a method of manufacturing a semiconductor device comprises the sep of forming a contact hole having a plurality of stair-like steps over the whole peripheral wall of a contact hole for multilayer wiring, and the step of forming a wiring metal film by the use of bias sputtering.

According to the first-mentioned expedient, the ratio of the vertical length to the horizontal length of the contact hole, namely, the aspect ratio of the contact hole at each step portion can be made small, so that the step coverage of wiring in the contact hole can be enhanced. Moreover, when an alumina film on the surface of the lower-layer wiring is cleaned by sputter-etching, the rate at which an inter-layer insulator film is etched to cause the etched and scattered insulator to adhere to the surface of the lower-layer wiring becomes slight, so that the inferior continuity between upper-layer wiring and the lower-layer wiring can be prevented.

Further, according to the second-mentioned expedient, the aspect ratio of the contact hole at each step portion can be made small in any viewing direction, and the step coverage of the wiring metal film formed by the bias sputtering is very good, whereby the step coverage of the wiring in the contact hole can be enhanced irrespective of the direction of this wiring.

DESCRIPTION OF THE PREFERRED EMBODIMENTS

Now, the present invention will be concretely described in conjunction with embodiments by reference to the drawings.

Throughout the drawings, parts having identical functions are assigned the same symbols, and they shall not be repeatedly described.

Embodiment 1

Figure 1:
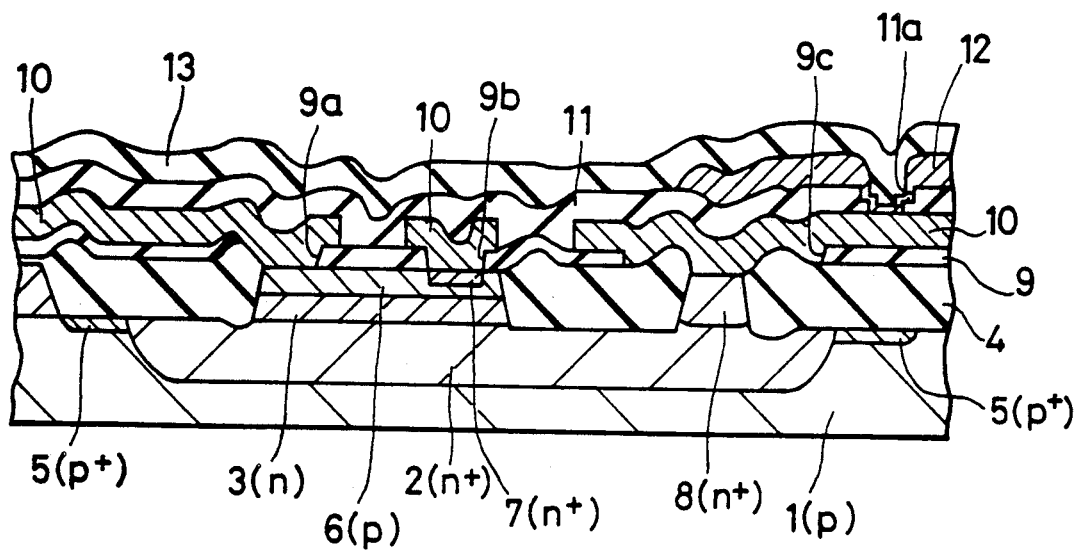
FIG. 1 is a sectional view showing a bipolar LSI which is an embodiment of the present invention.

As shown in FIG. 1, in a bipolar LSI according to this embodiment, the surface of a semiconductor substrate, for example, p-type silicon substrate 1 is provided with a buried layer 2 of, for example, n+-type, and an epitaxial layer 3 of, for example, n-type silicon is formed on the semiconductor substrate 1. A field insulator film, for example, silicon-dioxide ($SiO_2$) film 4 is formed in selected parts of the epitaxial layer 3, thereby to effect isolation among elements and isolation within each element. A channel stopper region 5 of, for example, p+-type underlies the field insulator film 4. A base region 6 of, for example, p-type is formed in the part of the epitaxial layer 3 isolated by the filed insulator film 4, and an emitter region 7 of, for example, n+-type is formed in the base region 6. Incidentally, a collector region is constructed of the part of the epitaxial layer 3 underlaying the base region 6. Besides, numeral 8 designates a collector lead-out region of, for example, n+-type which is connected with the buried layer 2. Further, number 9 designates an insulator film, for example, $SiO_2$ film. A first layer of wiring 10 (lower-layer wiring) made of, for example, aluminium film is laid so as to be connected with the base region 6, emitter region 7 and collector lead-out region 8 through openings 9a–9c which are provided in the insulator film 9. Yet further, an inter-layer insulator film 11 consisting of, for example, a thin $Si_3N_4$ film and a comparatively thick $SiO_2$ film deposited thereon is formed so as to cover the wiring 10, and a second layer of wiring 12 (upper-layer wiring) made of, for example, aluminium film is laid so as to be connected with the first layer of wiring 10 through a contact hole 11a which is provided in the inter-layer insulator film 11. Numeral 13 indicates an insulator film for passivation.

Figure 2:
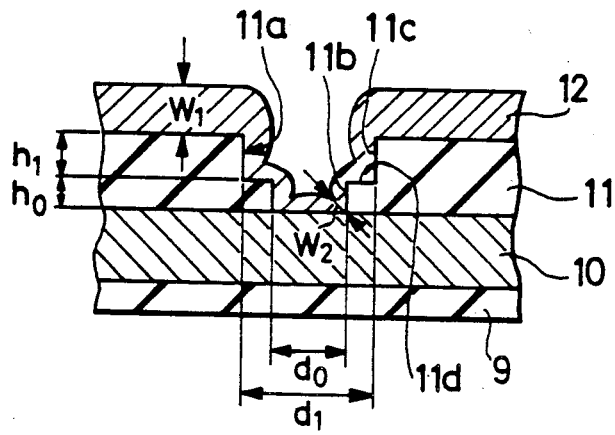
FIG. 2 is an enlarged sectional view of a contact hole and the vicinity thereof in the bipolar LSI shown in FIG. 1.
Figure 3:
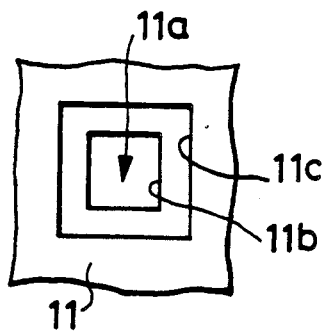
FIGS. 3 and 4 are plan views each showing an example of the plane shape of the contact hole in the bipolar LSI shown in FIG. 1.
Figure 4:
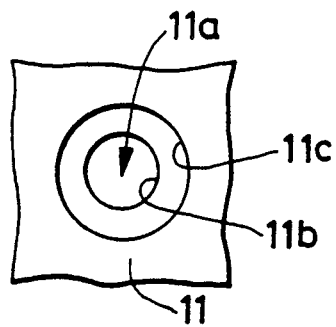

As shown in FIG. 2, the contact hole 11a has the whole peripheral wall thereof composed of planes 11b and 11c substantially perpendicular to the surface of the semiconductor substrate 1, and a plane 11d substantially parallel to the same. That is, the planes 11 b, 11c and the plane 11d define an angle substantially equal to 90 degrees, and they are in a configuration having two stair-like steps by way of example. In addition, the contact hole 11a can be formed into a tetragonal (square or oblong) or circular plane shape as shown in FIG. 3 or FIG. 4 by way of example. As a method of forming the contact hole 11a, photolithography is employed. In this case, either electron-beam exposure or ultraviolet-light exposure is chiefly used as an expedient for exposing a photoresist in order to pattern it. The electron-beam exposure is easy of forming the contact hole in the shape of a right-angled quadrilateral as shown in FIG. 3, in relation to electron-beam projection, and it is well suited to form the contact hole in the above shape.

On the other hand, the contact hole having a curved shape as shown in FIG. 4 can be easily formed using ultraviolet light as exposing light. Besides, when the ultraviolet light is used for the exposure, the shape of a contact hole formed is liable to become curved.

The planes 11b and 11c are perpendicular to the substrate surface as stated above. Therefore, in the case where, before the formation of the second layer of wiring 12, an alumina ($Al_2O_3$) film formed on the surface of the first layer of aluminium wiring 10 during the process of manufacture is sputtered and etched for removal, the situation in which the peripheral wall of the contact hole 11a is etched to scatter the material $SiO_2$ and to cause it to adhere on the surface of the first layer of wiring 10 can be prevented to the utmost. This is based on the fact that, wince the planes 11b and 11c in the peripheral wall of the contact hole 11a extend substantially in parallel with the traveling direction of sputtering particles, these sputtering particles hardly collide against the planes 11b and 11c. Moreover, even when the material $SiO_2$ is sputtered and etched from the planes 11b and 11c, the part $SiO_2$ sputtered and etched from the plane 11c adheres on the parallel plane 11d, and hence, only the part $SiO_2$ sputtered and etched from the plane 11b adheres on the surface of the first layer of wiring 10, so that the absolute amount of the adhering $SiO_2$ is slight. It is accordingly possible to prevent the interior continuity between the wiring layers 10 and 12 attributed to the adhesion of the insulator $SiO_2$ on the surface of the first layer of wiring 10. Besides, since the whole peripheral wall of the contact hole 11a is put into the configuration having the stair-like steps, the aspect ratio of the contact hole at each step portion can be made small in any viewing direction. In consequence, whichever direction the wiring 12 extends in relative to the wiring 10, the step coverage in the contact hole 11a can be enhanced. Accordingly, the density of current to flow through the wiring 12 in the contact hole 11a can be heightened. In addition, even when the contact hole 11a is microminiaturized to be, for example, smaller than about 1.5 μm in diameter, the favorable step coverage as stated above can be attained.

In a case where the dimensions of the individual parts of the contact hole 11a are denoted as indicated in FIG. 2, they can be selected at various values as may be needed, and the step coverage having a coverage rate of, for example, at least 0.2 can be attained by selecting the dimensions so as to establish the aspect ratio of the contact hole at each step portion; $A = h_n/d_n < 0.5$ (n=0,1) by way of example. Here, the "coverage rate" is defined as the ratio $w_2/w_1$ of the thickness $w_2$ of the wiring 12 at the bottom corner of the contact hole to the thickness $w_1$ of the flat part of this wiring as illustrated in FIG. 2. The above fact is supported by the result from an experiment which was separately conducted by the inventors; that when a conventional contact hole having a perpendicular peripheral wall has a diameter of, for example, 1.5 μm or 2.5 μm, the aspect ratio of the contact hole (A) for achieving the coverage rate of at least 0.2 becomes 0.46 or 0.48 by way of example, respectively.

Next, there will be described an example of a method of manufacturing the bipolar LSI according to this embodiment constructed as stated above.

As shown in FIG. 1, a buried layer 2 and a channel stopper region 5 are firs formed in the surface of a semiconductor substrate 1, whereupon an epitaxial layer 3 is formed on the semiconductor substrate 1 by, for example, epitaxial growth. Subsequently, selected parts of the epitaxial layer 3 are thermally oxidized, whereby a field insulator film 4 is formed to effect isolation among elements and isolation within each element. At the next step, a base region 6 is formed within the epitaxial layer 3 isolated by the field insulator film 4, using a mask of predetermined shape and by, for example, ion implantation. Likewise, a collector lead-out region 8 is formed. Subsequently, an emitter region 7 is formed within the base region 6 by the ion implantation of a diffusing impurity by way of example. Subsequently, an insulator film 9 is formed on the whole surface of the resultant structure, and predetermined parts of the insulator film 9 are etched and removed to form openings 9a–9c. Thereafter, an aluminium film, for example, is formed on the whole surface by sputtering by way of example, and it is patterned by dry etching by way of example, whereby a first layer of wiring 10 is formed.

Figure 5:
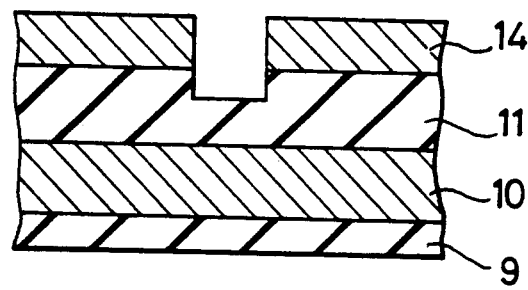
FIGS. 5 thru 7 are sectional views for explaining in the order of steps a method of forming the contact hole in the bipolar LSI shown in FIG. 1.
Figure 6:
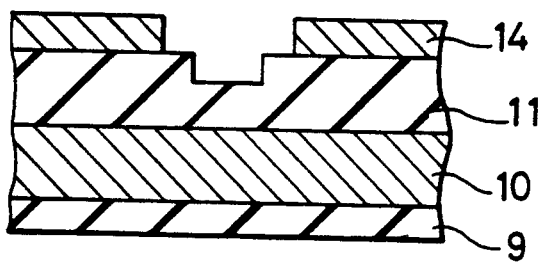
Figure 7:
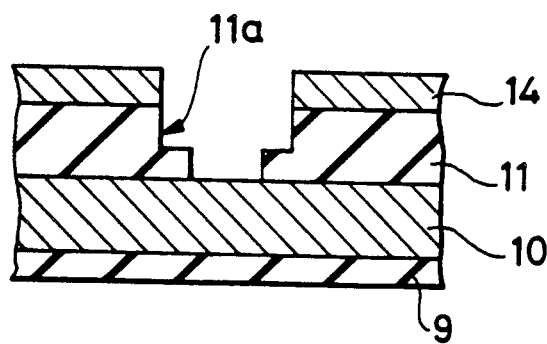

Subsequently, an inter-layer insulator film 11 is formed on the whole surface, whereupon a photo-resist 14 in a predetermined shape is applied on the insulator film 11 as shown in FIG. 5. The width of the opening of the photoresist 14 corresponds to the diameter $d_0$ of the bottom part of a contact hole 11a to be formed (refer to FIG. 2). Next, the insulator film 11 is subjected to dry etching for a predetermined period of time by employing the photoresist 14 as a mask. So-called "plasma ashing," for example, is subsequently carried out for a predetermined period of time, whereby the photoresist 14 is retracted into a shape shown in FIG. 6. On this occasion, also the thickness of the photoresist 14 decreases. The width of the opening of the photoresist 14 in this state corresponds to the diameter $d_1$ of the top part of the contact hole 11a (refer to FIG. 2). At the next step, using this photoresist 14 as a mask, the insulator film 11 is subjected to dry etching for a predetermined period of time again, whereby the contact hole 11a whose peripheral wall has a stair-like configuration is formed as shown in FIG. 7. The photoresist 14 is subsequently removed, whereupon a second layer of wiring 12 and an insulator film 13 are formed as shown in FIG. 1. Then, the intended bipolar LSI is finished up.

According to the foregoing method of manufacture, the stair-like contact hole 11a as stated above can be readily formed by the single photolithographic step and the etching steps, and the manufacturing process is simple.

While, in the above, the invention made by the inventors has been concretely described in conjunction with the embodiment, it is a matter of course that the present invention is not restricted to the foregoing embodiment, but that it can be variously modified within a scope not departing from the purport thereof.

By way of example, the embodiment stated before has referred to the case where the contact hole 11a has the two stair-like steps, but three or more stair-like steps can also be provided as may be needed. Besides, the present invention is also applicable to the case of a contact hole which is provided in an insulator film for the purpose of connecting a diffused layer formed in a semiconductor substrate and wiring to come into ohmic contact with the diffused layer.

Further, the present invention is applicable to various bipolar IC's, various MOS IC's, and BiCMOS IC's in each of which bipolar type semiconductor elements and MOS type semiconductor elements are formed on an identical semiconductor substrate, and to various semiconductor integrated circuit devices such as logic LSI's, memory LSI's and dynamic RAM (random access memory) LSI's.

Still further, the upper-layer wiring or lower-layer wiring is not restricted to the wiring whose principal component is aluminium and which is formed by the sputtering, but it may well be formed by CVD, vacuum evaporation or the like. The wiring material principally containing aluminium is not restrictive, either, but the upper-layer wiring may well be made of a polycrystalline silicon material of low resistivity, or the like.

Yet further, the inter-layer insulator film is not restricted to the double-layer insulator film of $Si_3N_4/SiO_2$ in the foregoing embodiment, but various other insulator films such as a PSG film and an $SiO_2$ film can be used.

By the way, anisotropic etching or RIE (reactive ion etching) is used in the present invention. This technique itself has been known, and has been already employed for various purposes in the production of semiconductor devices.

In brief, the "anisotropic etching" is a term as opposed to "isotropic etching" and has the same significance as "directive etching." A case where etching rates in the depth direction and horizontal direction of a pattern are substantially equal, is called the isotropic etching. In contrast, a case where the etching rate in the depth direction is greater than in the horizontal direction is called the anisotropic etching because of the direction-dependency of the etching rate. In principle, the anisotropic etching gives rise to a directivity on the basis of irradiation with cations within a plasma. Accordingly, the anisotropic etching can be achieved by the RIE.

In this regard, there are RIE apparatuses in various aspects. An example of the apparatuses includes two parallel-plate electrodes within a chamber. One electrode has radio-frequency power applied thereto through a matching circuit, while the other electrode is grounded similarly to the wall of the chamber. A case where a sample to be etched is placed on the radio-frequency electrode, corresponds to the RIE. A case where the sample is placed on the grounded electrode, is distinguished as parallel-plate electrode type plasma etching. In the former case, a minus self-bias acting on the sample is greater, and the ions play a more important role in the etching.

Embodiment 2

First, the construction of a bipolar LSI fabricated by a method of manufacturing the bipolar LSI according to this embodiment will be described in order to facilitate the description.

Figure 8:
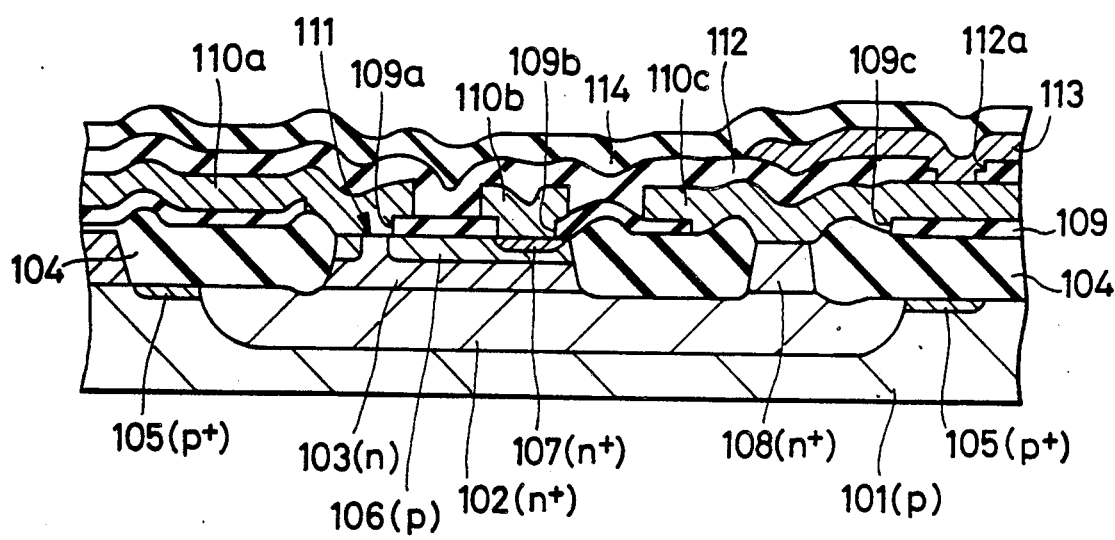
FIG. 8 is a sectional view showing a bipolar LSI manufactured by a method of manufacturing the bipolar LSI according to another embodiment of the present invention.

As shown in FIG. 8, in the bipolar LSI according to this embodiment, the surface of a semiconductor substrate, for example, 1-type silicon substrate 101 is provided with a buried layer 102 10 of, for example, n+-type, and an epitaxial layer 103 of, for example, n-type silicon is formed on the semiconductor substrate 101. A field insulator film, for example, SiO$_2$ film 104 is formed in selected parts of the epitaxial layer 103, thereby to effect isolation among elements and isolation within each element. A channel stopper region 105 of, for example, p+-type underlines the field insulator film 104. A base region 106 of, for example, p-type is formed in the part of the epitaxial layer 103 isolated by the field insulator film 104, and an emitter region 107 of, for example, n+-type is formed in the base region 106. An n-p-n bipolar transistor is constructed of the emitter region 107, the base region 106, and a collector region formed of the part of the epitaxial layer 103 underlying the base region 106. Besides, numeral 108 designates a collector lead-out region of, for example, n+-type which is connected with the buried layer 102. Further, numeral 109 designates an insulator 5 film, for example, SiO$_2$ film. A first layer of wiring (lower-layer wiring) composed of wiring leads 110a–110c and made of, for example, an aluminium film is laid so that the wiring leads may be respectively connected with the base region 106, emitter region 107 and collector lead-out region 108 through openings 109a–109c which are provided in the insulator film 109. One 110a of the wiring leads and the epitaxial layer 103 forming the collector region construct a Schottky barrier diode (SBD) 111 which is connected between the base and collector of the n-p-n bipolar transistor. Yet further, an inter-layer insulator film 112 consisting of, for example, a thin Si$_3$N$_4$ film and a comparatively thick SiO$_2$ film deposited thereon is formed so as to cover the wiring leads 110-110c, and a second layer of wiring (upper-layer wiring) 113 made of, for example, an aluminium film is laid so as to be connected with the first layer of wiring through a contact hole 112a which is provided in the interlayer insulator film 112. Numeral 114 indicates an insulator film for passivation.

Figure 9:
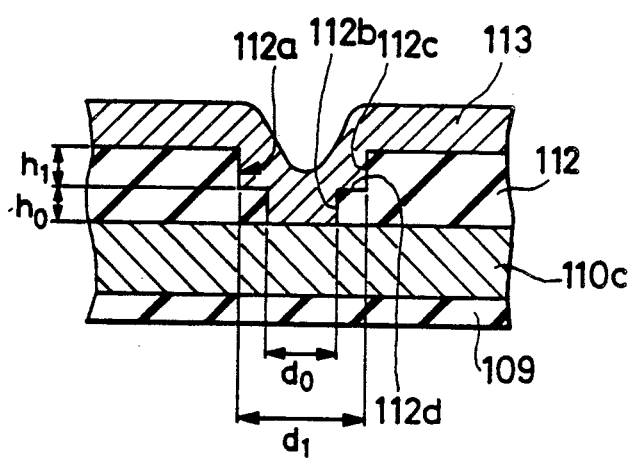
FIG. 9 is an enlarged sectional view of a contact hole and the vicinity thereof in the bipolar LSI shown in FIG. 8.

As shown in FIG. 9, the contact hole 112a has the whole peripheral wall thereof formed into a configuration having two stair-like steps by way of example as composed of planes 112b and 112c substantially perpendicular to the surface of the semiconductor substrate 101, and a plane 112d substantially parallel to the same.

Figure 10:
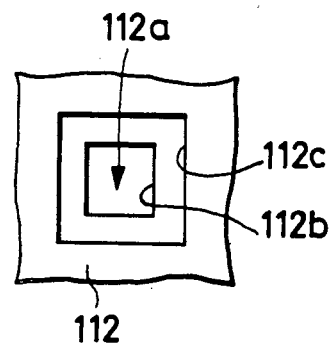
FIGS. 10 and 11 are plan views each showing an example of the plane shape of the contact hole in the bipolar LSI shown in FIG. 8.
Figure 11:
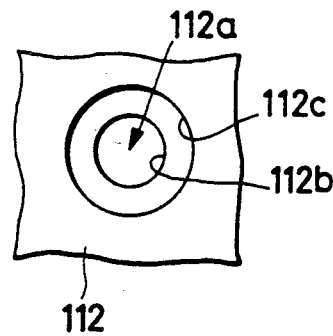

In addition, the contact hole 112a can be formed into any desired plane shape including a tetragonal (oblong or square) or circular plane shape as shown in FIG. 10 or FIG. 11 by way of example.

Next, there will be described the method of manufacturing the bipolar LSI according to this embodiment.

As shown in FIG. 8, a buried layer 102 and a channel stopper region 105 are first formed in the surface of a semiconductor substrate 101, whereupon an epitaxial layer 103 is formed on the semiconductor substrate 101 by, for example, epitaxial growth. Subsequently, selected parts of the epitaxial layer 103 are thermally oxidized, whereby a field insulator film 104 is formed to effect isolation among elements and isolation within each element. At the next step, a base region 106 is formed within the epitaxial layer 103 isolated by the field insulator film 104, using a mask of predetermined shape and by, for example, ion implantation. Likewise, a collector lead-out region 108 is formed. Subsequently, an emitter region 107 is formed within the base region 106 by ion implantation by way of example. Subsequently, an insulator film 109 is formed on the whole surface of the resultant structure, and predetermined parts of the insulator film 109 are etched and removed to form openings 109a–109c. Thereafter, an aluminium film, for example, is formed on the whole surface by sputtering by way of example, and it is patterned by dry etching by way of example, whereby a first layer of wiring composed of wiring leads 110a–110c is formed. Thereafter, an inter-layer insulator film 112 is formed on the whole surface.

Figure 12:
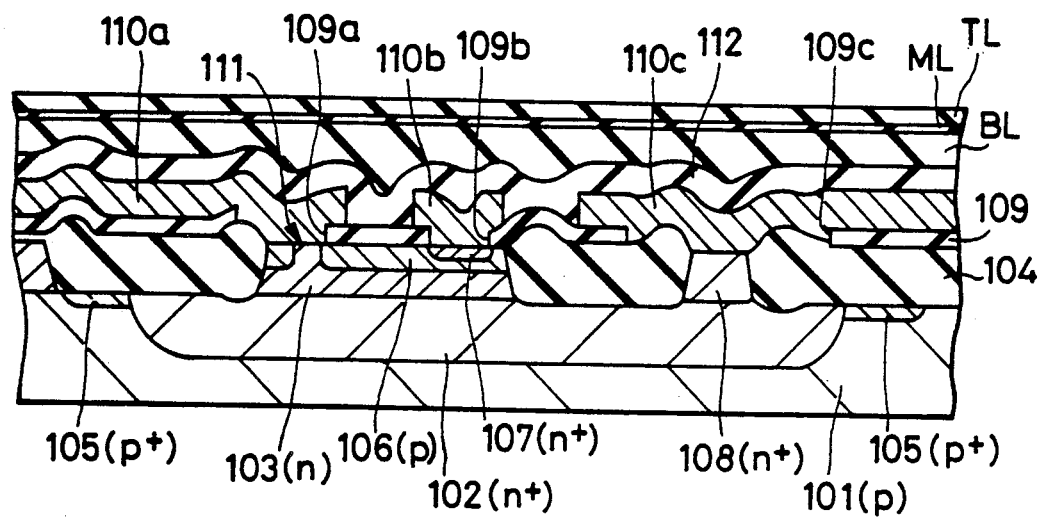
FIGS. 12 thru 17 are sectional views for explaining in the order of steps the method of manufacturing the bipolar LSI of the present invention as shown in FIG. 8.

Subsequently, as shown in FIG. 12, a flattening bottom-layer resist BL, a middle layer, for example, spin-on-glass (SOG) film ML, and a top-layer resist TL are successively formed on the whole surface of the insulator film 112.

Concretely, the bottom-layer resist BL is formed to a thickness of 3–4 μm by spinner coating. As the middle layer ML, the SOG film is formed to a thickness of 0.1–0.2 μm by the spinner coating. Further, the top-layer resist TL is formed to a thickness of 0.5–1 μm by the spinner coating. In order to achieve a process condition and a mask function, the bottom-layer resist BL should preferably be three or more times as thick as the top-layer resist TL.

Figure 13:
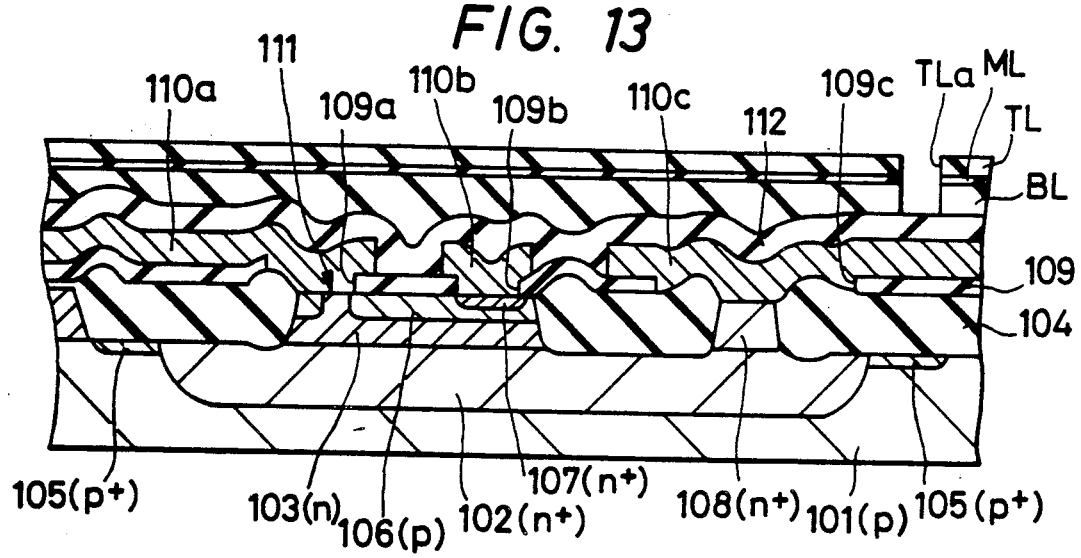

At the next step, as shown in FIG. 13, the top-layer resist TL is patterned so as to form an opening TL$_a$ which has a width corresponding to the diameter d$_0$ of the bottom part of a contact hole to-be-formed 112a (refer to FIG. 9), the middle layer ML is anisotropically etched by, for example, reactive ion etching (hereinbelow, abbreviated to "RIE") by employing the resultant top-layer resist TL as a mask, and the bottom layer BL is also anisotropically etched by the RIE by employing as a mask the middle layer ML patterned as stated above. Thereafter, the middle layer ML is removed.

Figure 14:
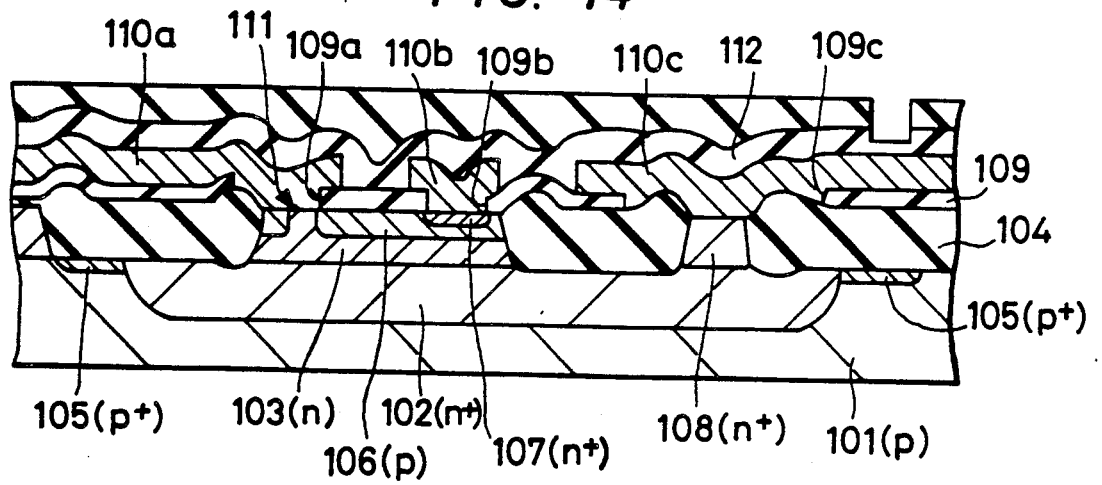

Subsequently, as shown in FIG. 14, the insulator film 112 is anisotropically etched down to a depth equal to, for example, the half of the thickness thereof by, for example, the RIE in which the bottom-layer resist BL patterned as stated above is used as a mask.

Figure 15:
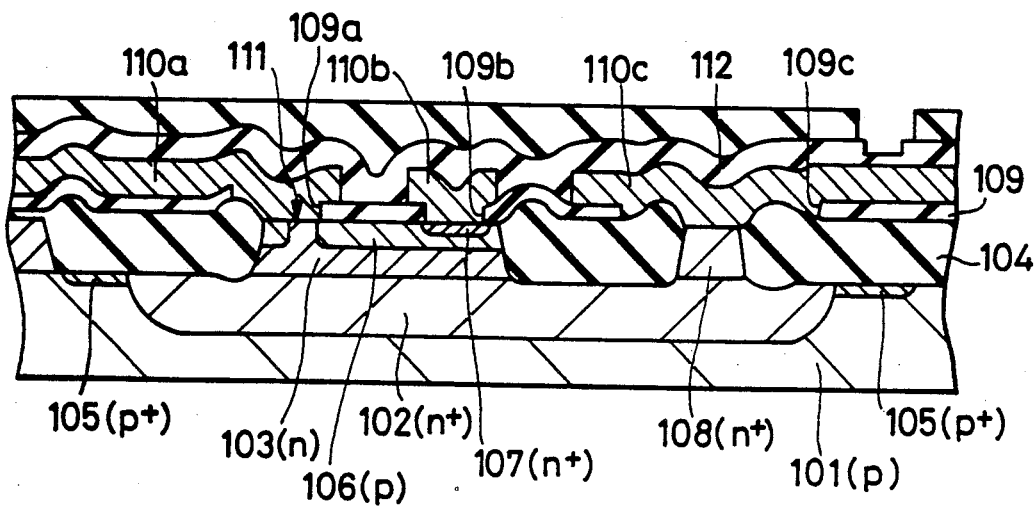
Figure 16:
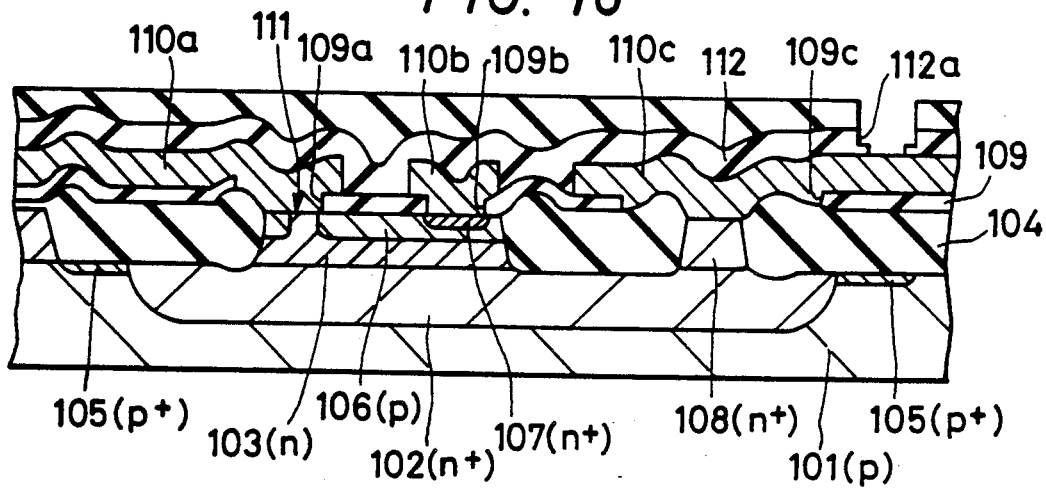

So-called "plasma ashing," for example, is subsequently carried out for a predetermined period of time, whereby the bottom-layer resist BL is retracted into a shape shown in FIG. 15. The width of the opening of the bottom-layer resist BL in this state corresponds to the diameter d$_1$ of the top part of the contact hole 112a (refer to FIG. 9). On this occasion, also the thickness of the bottom-layer resist BL decreases. At the next step, using this bottom-layer resist BL as a mask, the insulator film 112 is subjected to anisotropic etching by, for example, the RIE again, whereby the contact hole 112a whose peripheral wall has a stair-like configuration is formed as shown in FIG. 16. Since, in this manner, the whole peripheral wall of the contact hole 112a is put into the configuration having the stair-like steps, the aspect ratio of the contact hole, namely, $A = h_n/d_n (n=0, 1)$ at each step portion (refer to FIG. 9) can be made small in any viewing direction. In consequence, whichever direction wiring 113 extends in relative to the wiring 110, the step coverage in the contact hole 112a can be enhanced. That is, the step coverage of the wiring 113 in the contact hole 112a can be enhanced irrespective of the extending direction of this wiring 113. Accordingly, the density of current to flow through the wiring 113 in the contact hole 112a can be heightened. In addition, even when the contact hole 112a is microminiaturized to be, for example, smaller than about 1.5 μm in diameter, the favorable step coverage as stated above can be attained.

Figure 17:
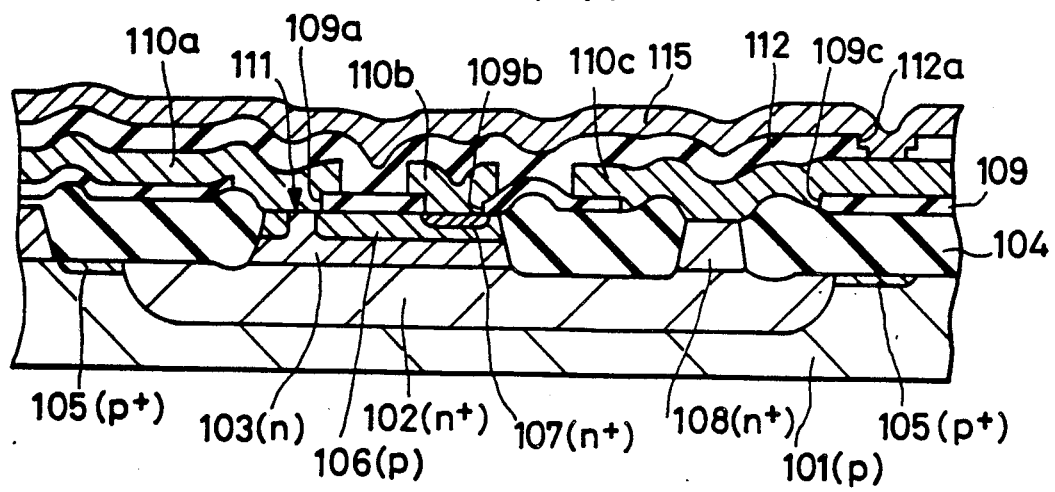

Subsequently, the bottom-layer resist BL is removed, whereupon a wiring metal film, for example, aluminium film 115 for forming the second layer of wiring 113 is formed on the whole area of the resultant structure by bias sputtering as shown in FIG. 17. The bias sputtering presents a resputtering effect in which part of a metal once deposited is etched again, so that the step coverage of the metal film 115, accordingly the wiring 113 in the contact hole 112a is extraordinarily favorable. The effect of the enhancement of the step coverage based on the adoption of the bias sputtering cooperates with the effect of the enhancement of the step coverage based on the fact that the whole peripheral wall of the contact hole 112a is put into the configuration having the stair-like steps as stated above. As a result, the step coverage becomes very favorable in such a manner that a coverage rate of, for example, about 1 is exhibited at the central part of the contact hole 112a and that a coverage rate of, for example, about 0.5-0.6 or more is exhibited even at the other parts. By the way, as a known publication on multilayer wiring-forming techniques based on bias sputtering, there is a monthly "Semiconductor World," October 1984, p. 121–p. 128 issued under the date of Sept. 15, 1984 by Kabushiki-Kaisha Press Journal. Bias sputtering apparatuses, the principle of the bias sputtering, etc. are explained in detail in this publication.

Subsequently, the metal film 115 is patterned into a predetermined shape by etching so as to form the second layer of wiring 113, whereupon an insulator film 114 is formed. Then, the intended bipolar LSI is finished up as shown in FIG. 8.

While, in the above, the invention made by the inventors has been concretely described in conjunction with the embodiment, it is a matter of course that the present invention is not restricted to the foregoing embodiment, but that it can be variously modified within a scope not departing from the purport thereof.

By way of example, the embodiment stated before has referred to the case where the contact hole 112 has the two stair-like steps, but three or more stair-like steps can also be provided as may be needed. Besides, the present invention is also applicable to the case of a contact hole which is provided in an insulator film for the purpose of connecting wiring and a diffused layer formed in a semiconductor substrate.

Further, the present invention is applicable to various bipolar Ic's, various MOS Ic's, and BiCMOS Ic's in each of which bipolar type semiconductor elements and MOS type semiconductor elements are formed on an identical semiconductor substrate, and to various semiconductor integrated circuit devices such as logic LSI's, memory LSI's and dynamic RAM (random access memory) LSI's.

Still further, the upper-layer wiring or lower-layer wiring is not restricted to the wiring whose principal component is aluminium and which is formed by the sputtering, but it may well be formed by CVD, vacuum evaporation or the like. The wiring material principally containing aluminium is not restrictive, either, but the upper-layer wiring may well be made of a polycrystalline silicon material of low resistivity, or the like.

Yet further, the inter-layer insulator film is not restricted to the double-layer insulator film of $Si_3N_4/SiO_2$ in the foregoing embodiment, but various other insulator films such as a PSG film and an $SiO_2$ film can be used.

What is claimed is:

1. A method of manufacturing a semiconductor integrated circuit device comprising the steps of:
   (a) preparing a semiconductor substrate having a main surface;
   (b) forming a plurality of semiconductor elements on said main surface;
   (c) forming a first inter-layer insulator film over a plurality of said semiconductor elements;
   (d) forming a first contact hole in said first inter-layer insulator film;
   (e) forming a first wiring layer on said first inter-layer insulator film, said first wiring layer being made of a material whose principal component is aluminum and being electrically connected with at least one of said semiconductor elements via said first contact hole;
   (f) forming a second inter-layer insulator film over said first wiring layer;
   (g) forming a second contact hole in said second inter-layer insulator film by etching to an upper surface of said first wiring layer, a sectional shape of said second contact hole being a configuration which has a plurality of stair-like steps along each of peripheral walls of said second contact hole, said stair-like steps being formed by first peripheral wall planes extending in a vertical direction and a second peripheral wall plane extending in a horizontal direction, said each first peripheral wall plane and said second peripheral wall plane defining an angle of substantially 90 degrees;
   (h) after step (g), sputter-etching at least said exposed upper surface of said first wiring layer;
   (i) forming a second wiring layer on said second inter-layer insulator film, said second wiring layer being electrically connected with said first wiring layer via said second contact hole.

2. A method of manufacturing a semiconductor integrated circuit device according to claim 1, wherein said step (h) includes a step of removing a layer of alumina film formed on said first wiring layer by said sputter-etching.

3. A method of manufacturing a semiconductor integrated circuit device according to claim 2, wherein said layer of alumina film is formed by a surface oxidation of said first wiring layer.

4. A method of manufacturing a semiconductor integrated circuit device according to claim 3, wherein said layer of alumina is $Al_2O_3$ film.

5. A method of manufacturing a semiconductor integrated circuit device according to claim 1, wherein said second inter-layer insulator film is a silicon dioxide film.

6. A method of manufacturing a semiconductor integrated circuit device according to claim 1, wherein said second inter-layer insulator film is composed of a silicon nitride film and a silicon dioxide film formed on said silicon nitride film.

7. A method of manufacturing a semiconductor integrated circuit device according to claim 1, wherein a plane shape of said second contact hole is a configuration which has a square.

8. A method of manufacturing a semiconductor integrated circuit device according to claim 1, wherein a plane shape of said second contact hole is a configuration which has a circle.

9. A method of manufacturing a semiconductor integrated circuit device according to claim 1, wherein said second wiring layer is made of a material whose principal component is aluminum.

10. A method of manufacturing a semiconductor integrated circuit device according to claim 9, wherein said second wiring layer is formed by bias sputtering.

11. A method of manufacturing a semiconductor integrated circuit device according to claim 1, wherein said semiconductor elements include a bipolar transistor.

12. A method of manufacturing a semiconductor integrated circuit device according to claim 1, wherein said stair-like steps is formed along a whole peripheral wall of said second contact hole.

* * * * *

UNITED STATES PATENT AND TRADEMARK OFFICE
CERTIFICATE OF CORRECTION

PATENT NO. : 4,999,318

DATED : March 12, 1991

INVENTOR(S) : Tokunaga et al

It is certified that error appears in the above-identified patent and that said Letters Patent is hereby corrected as shown below:

On the title page, item [19] change "Takahumi et al." to --Tokunaga et al.--; please change item [75] Inventors: the names from "Tokunaga Takahumi"
"Tsuneoka Masatoshi"
"Akimori Hiroyuki"
"Horiuch Mitsuaki" to --Takahumi TOKUNAGA--
--Masatoshi TSUNEOKA--
--Hiroyuki AKIMORI--
--Mitsuaki HORIUCHI--

Signed and Sealed this

Twenty-eighth Day of July, 1992

Attest:

DOUGLAS B. COMER

*Attesting Officer*   *Acting Commissioner of Patents and Trademarks*